(12) United States Patent
Arkin et al.

(10) Patent No.: US 6,380,730 B1
(45) Date of Patent: Apr. 30, 2002

(54) INTEGRATED CIRCUIT TESTER HAVING A PROGRAM STATUS MEMORY

(75) Inventors: Brian J. Arkin, Pleasanton; John Mark Oonk, San Ramon, both of CA (US)

(73) Assignee: Credence Systems Corporation, Fremont, CA (US)

( * ) Notice: Subject to any disclaimer, the term of this patent is extended or adjusted under 35 U.S.C. 154(b) by 1 day.

(21) Appl. No.: 09/614,391

(22) Filed: Jul. 12, 2000

(51) Int. Cl.$^7$ .............................................. G01R 31/02
(52) U.S. Cl. .................................................... 324/158.1
(58) Field of Search ................................ 324/754, 755, 324/765, 158.1; 714/39, 47; 702/117, 118

(56) References Cited

U.S. PATENT DOCUMENTS

| | | | | |
|---|---|---|---|---|
| 5,497,079 A | * | 3/1996 | Yamada et al. | 324/158.1 |
| 6,151,687 A | * | 11/2000 | Claes | 714/39 |
| 6,192,495 B1 | * | 2/2001 | Totorica et al. | 714/718 |

* cited by examiner

Primary Examiner—Michael J. Sherry
Assistant Examiner—Russell M. Kobert

(74) *Attorney, Agent, or Firm*—Daniel J. Bedell; Smith-Hill and Bedell

(57) ABSTRACT

An integrated circuit (IC) tester employs a pattern generator including an instruction processor executing an algorithmic program stored in a program memory. The program defines a sequence of vectors defining test activities to be carried out during successive cycles of a test on an IC. In the course of executing the program, the instruction processor stores in various registers and counters "program status" data that the processor uses to keep track of program execution. The status data may include, for example, the current program memory address, loop and repeat counts, return addresses and the like. The pattern generator also includes a random access "program status" memory for storing a selected portion of the program status data at selected points during a test. The algorithmic program defining the vectors to be produced for each cycle of the test also selects a test event (such as a DUT failure) that is to trigger program status data storage during any test cycle, selects the particular status data to be stored in response to the test event, and selects the status memory address at which the data is to be stored. Test analysis software may read the program status data out of the program status memory following the test and use it to determine the status of program execution at the time the triggering events occurred.

17 Claims, 3 Drawing Sheets

INTEGRATED CIRCUIT TESTER HAVING A PROGRAM STATUS MEMORY

BACKGROUND OF THE INVENTION

1. Field of the Invention

Figure 1:
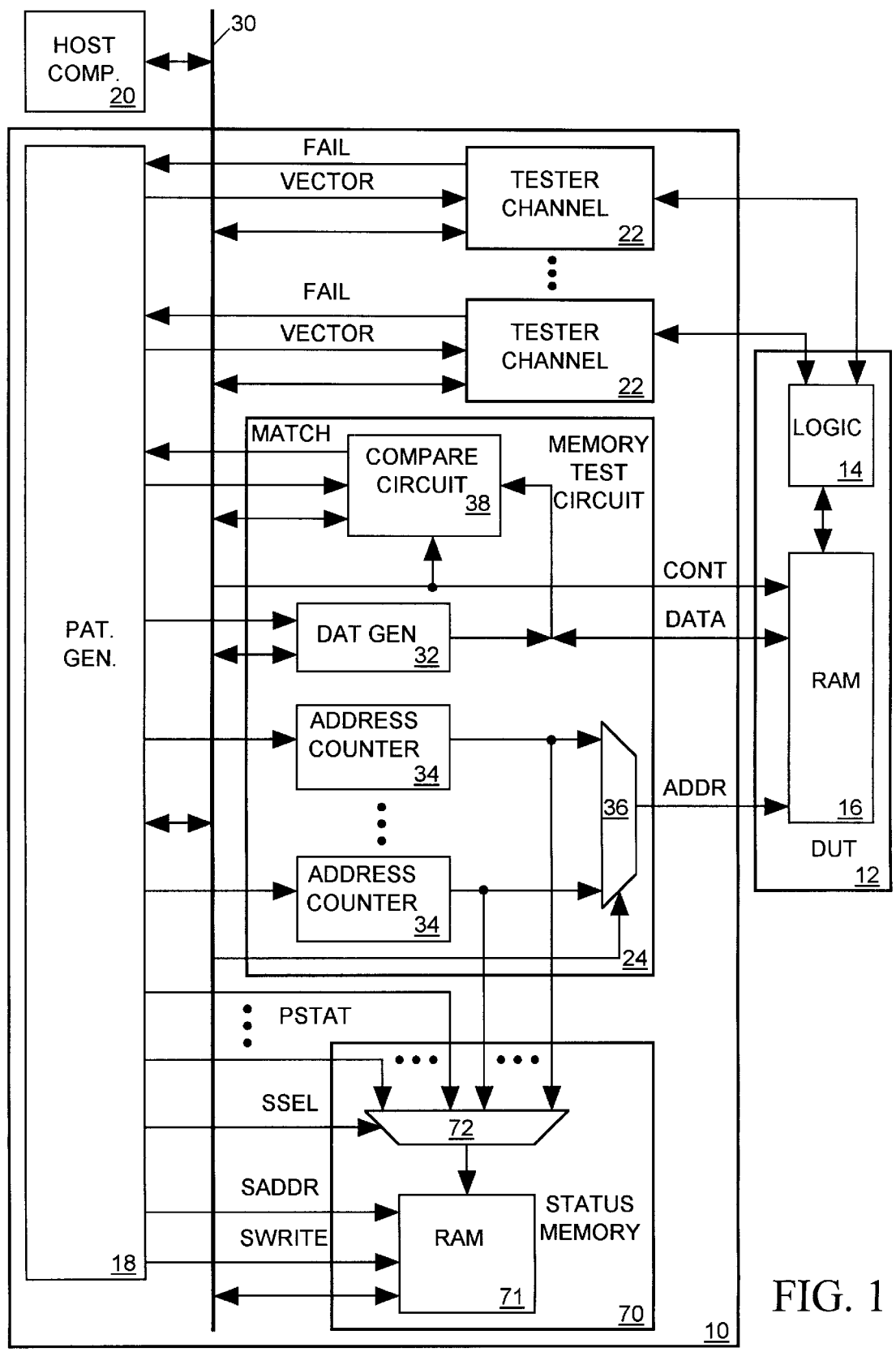

The present invention relates in general to integrated circuit (IC) testers and in particular to an IC tester having a memory for recording data indicating the status of a test program being executed.

2. Description of Related Art

Failure Analysis For Program Context

A typical integrated circuit (IC) tester organizes a test of a digital IC device under test (DUT) into a succession of test cycles. During each test cycle each tester channel may send a test signal to a DUT terminal or may sample DUT output signal at a DUT terminal to determine whether it is of an expected state. The sequence of activities carried out by each tester channel is determined by a sequence of data values (vectors), each defining the actions the tester channel is to carry out during one cycle of a test. Since tests can span many millions of test cycles, a vector sequence may include many millions of vectors. Since a tester would require a very large vector memory to store such a large vector sequence, many testers use algorithmic pattern generators to produce the vector sequences as they are needed during a test. An algorithmic pattern generator includes a program memory for storing a program for generating a sequence of data. An instruction processor included in the pattern generator executes the program to produce the data sequence during a test. The data sequence can be used directly as a vector sequence or to control addressing of a vector memory that reads out vectors as needed during a test.

Vector sequences (or vector memory addressing sequences) for many tests include repetitive sections that are more efficiently represented by repeat, loop and subroutine call instructions. For example a section of a vector sequence having 1024 successive one-byte vectors of value X can be represented in an algorithmic program as an instruction such as "REPEAT 1024 X". Depending on the manner in which it is encoded, this instruction can be represented in a program by a few bytes instead of 1024 bytes.

A entire section of a vector sequence that is repeated can be represented as an instruction loop. For example a 4096 byte section of a vector sequence in which four one-byte vector sequence W, X, Y and Z is repeated 1024 times can be represented with a relatively few bytes by the following lines of code:
LOOP 1024
W
X
Y
Z
LOOPEND A sequence of 26 vectors A, B . . . Y, Z that is repeated at many different locations throughout a main vector sequence can be represented in a program as a single callable subroutine. In such case the 25-vector sequence need only appear once in the program; each occurrence of the 26-vector sequence may be represented in the program by a simple subroutine call instruction requiring only a few bytes.

While algorithmic pattern generators allow IC testers to avoid having to store large vector sequences, they make it more difficult for test engineers to analyze test results. The vector each tester channel receives before the start of each test cycle indicates the DUT output signal state the tester channel is to expect during the test cycle. If the DUT output signal fails to match that state, the channel asserts an output FAIL signal that is processed to provide test results data to a test engineer. In addition to learning whether a DUT has failed a test, a test engineer often wants to determine why the DUT failed the test. To do that, the test engineer would like to know both the DUT output terminal failed and the point in the test program at which the failure occurred. That last bit of information, the "program context" of a failure, tells the test engineer the conditions under which the DUT failed.

IC testers can typically tell the test engineer the test cycle in which a particular DUT output signal failed. When testing an IC, an IC tester usually maintains a count of the number of test cycles it has carried out, and when one of the tester channels asserts a fail signal during some particular test cycle, the tester produces output data indicating both the channel that detected the failure and the current test cycle count.

When we know the test cycle in which the failure occurs, it is usually possible to determine the point in the test program that caused the DUT failure. However when the test program contains many repeats, nested loops, and subroutine calls it is not easy to do that quickly. Failure analysis software designed to locate a point in a program that produced a vector for a particular test cycle typically simulates execution of the test program while keeping track of such information as the current program memory address, repeat count, loop count values, stack contents etc., until it reaches the test cycle of interest. This information can then be used to determine the particular point in the program at which the DUT failed. However it can take longer for the simulation software to find the point of interest in the test program than it did for the tester to test the DUT. What is needed is a test system that provides sufficient information to enable a test engineer to quickly determine the program context of a test failure.

Some testers permit conditional branching during a test in response to test results, and in such case the course of the test depends on how the DUT behaves during the test. When a tester program is subject to conditional branching, failure analysis software cannot determine the program context of a failure from the cycle count because it does not have access to the test results that controlled branching during the test. Thus it is not always possible for failure analysis software to correlate a test cycle to a particular point in a test program.

What is needed is an integrated circuit tester architecture that provides information that enables failure analysis software to determine the program context of a failure when a test involves conditional branching.

Failure Analysis for Spare Row/Column Replacement

Random access memories (RAMs) are typically formed as arrays of rows and columns of memory cells. The input address to a RAM identifies the particular row and column of the cell to be read or write accessed. Some RAMs include spare rows and/or columns of memory cells so that when one of the RAM's cells is defective, the RAM can be modified to replace the row or column of a defective cell with one of its spare rows or columns. As it tests such a RAM, a RAM tester stores pass/fail data indicating whether each memory cell has passed or failed the test. After the RAM has been fully tested, the cell pass/fail data is provided to failure analysis software that determines how to best allocate spare rows and columns when repairing the RAM. Conventional RAM testers employ a memory as large as the RAM being tested for storing the pass/fail data for each cell of the RAM. After the RAM has been fully tested, the entire contents of the pass/fail data memory is transferred to a host computer running the failure analysis software. It would be beneficial to provide a RAM tester architecture than can provide failure analysis software with enough information to determine how to allocate spare rows and columns without having to include a memory large enough to store pass/fail data for each cell of the RAM under test. It would also be desirable if such information were compact so that it could be transferred quickly to the host computer.

Block Failures

Some non-volatile memories are organized into blocks of memory with each block having a separate block address. Thus a particular memory cell will have a block address, a row address and a column address. Such memory can be reconfigured to avoid using blocks that may have a minimum number of defective cells. To avoid having to provide a large memory for storing pass/fail data for all cells of all blocks a memory tester typically separately tests each memory block and sends pass/fail data to a host computer after each block test. Failure analysis software in the host computer then decides how to reconfigure the RAM to avoid using failed blocks based on the number of failed cells in each block. This process can be time-consuming since the tester has to be stopped and restarted once for each memory block. What is needed is a tester architecture that, with employing a large pass/fail memory, fully tests all blocks and then transmits a relatively small amount of data to the host computer sufficient to enable the failure analysis software to determine the number of cell failures in each memory block.

SUMMARY OF THE INVENTION

An integrated circuit (IC) tester in accordance with the invention employs a pattern generator including an instruction processor executing an algorithmic program stored in a program memory. The program defines a test instruction sequence produced by the instruction processor for controlling the course of a test being performed on an IC. In the course of executing the program, the instruction processor stores in various registers and counters "program status" data used to keep track of program execution. The status data may include, for example, the current program memory address, loop and repeat counts, return addresses and the like.

In accordance with one aspect of the invention, the pattern generator also includes a random access "program status" memory controlled by the instruction processor for receiving and storing selected portions of the program status data at selected points during a test. Analysis software can use this information after the test, for example, to determine how the program conditionally branched during the test to determine the program context of failures.

In accordance with a second aspect of the invention, the algorithmic program defining the data sequence controlling test activities during each test cycle also defines a sequence of status memory instructions. These instructions tell the instruction processor which portion, if any, of the program status data is to be stored in the status memory during each test cycle, the address at which the status data is to be stored, and the conditions that trigger status data storage.

In accordance with a third aspect of the invention, the tester also includes a set of address counters controlled by the pattern generator for providing memory addresses when the tester is testing a random access memory (RAM). The program instructions can tell the status memory to record the address data generated by selected counters when a cell of the RAM being tested fails a test. The address data stored in the status memory can, for example, provide a basis for determining how to allocate the RAM's spare rows and columns for determined which of its memory blocks should not be used.

It is accordingly an object of the invention to provide a means for allowing a tester to store selected program status data that may allow test analysis software to determine the course of a test involving conditional branching so that it may determine the program context of DUT failures or other detectable events.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

Figure 2:
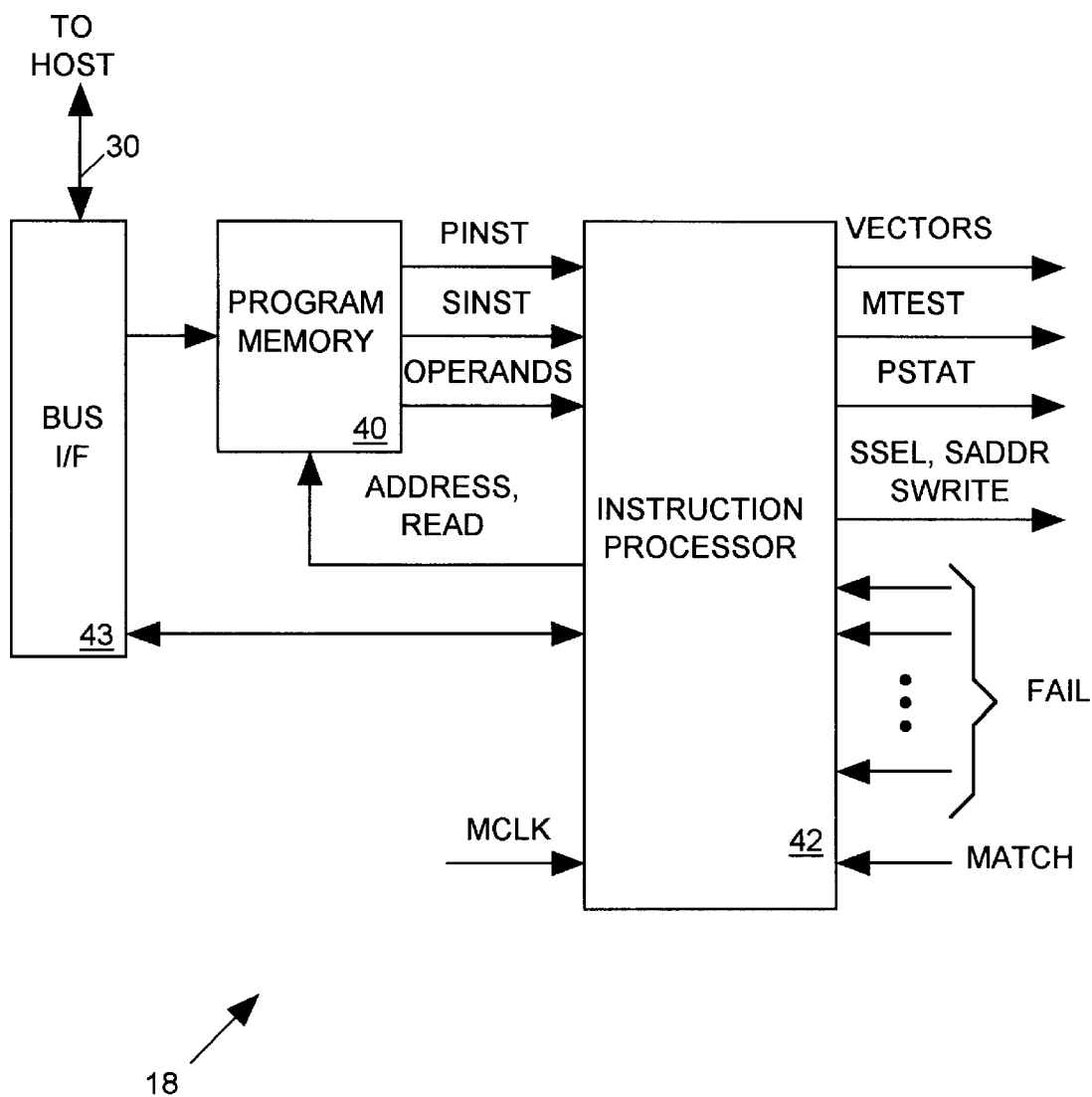
Figure 3:
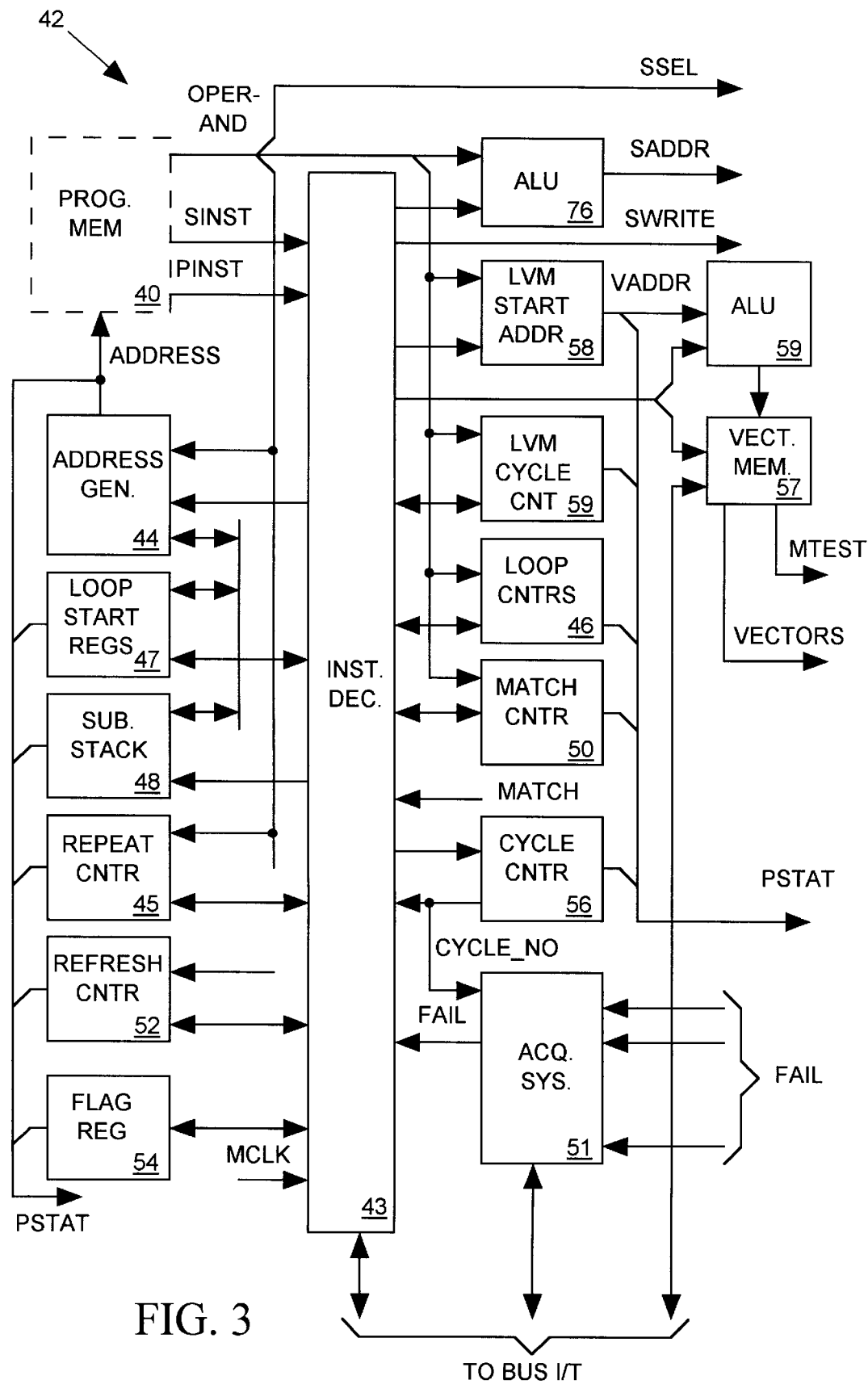

FIG. 1 illustrates in block diagram form an integrated circuit tester employing a status memory in accordance with the present invention, FIG. 2 illustrates the pattern generator of FIG. 1 in more detailed block diagram form, and FIG. 3 illustrates the instruction processor of FIG. 2 in more detailed block diagram form.

DESCRIPTION OF THE PREFERRED EMBODIMENT(S)

Tester Architecture

FIG. 1 is a top level block diagram of an integrated circuit (IC) tester 10 for testing an IC device under test (DUT) 12 that may contain logic circuits 14 and an internal random access memory (RAM) 16. Tester 10 includes an algorithmic pattern generator 18 programmed by an external host computer 20 for supplying vectors (control data words) to a set of conventional tester channels 22 for performing a digital logic test on logic circuit 14. Pattern generator 18 may also supply control data to a conventional memory test circuit 24 for separately testing RAM 16.

Tester 10 organizes a digital logic test into a succession of test cycles, and during each test cycle each tester channel 22 may send a test signal input to a terminal of DUT logic circuit 14 or may sample and determine the state of an output signal produced by logic circuit 14 at that terminal. Pattern generator 18 supplies a vector as input to each tester channel 22 at the start of each test cycle. That vector indicates the activity or activities to be carried out during the test cycle and also indicates times during the test cycle when the activities are to be carried out. When a vector indicates that a tester channel 22 is to monitor a logic circuit 14 output signal during a test cycle, the vector also indicates an expected state of the output signal. When a tester channel 22 detects that a logic circuit 14 output signal is of an unexpected state, it returns a FAIL signal to pattern generator 18. The manner in which pattern generator 18 may respond to a FAIL signal is described below.

When testing RAM 16, memory test circuit 24 writes data into each RAM storage location, reads the data back out, and then compares the data read in to the data read out to determine whether they match. Memory tester 24 includes a data generator 32 for decoding an output control data field of pattern generator 18 to produce the data field (DATA) to be written into RAM 16. Host computer 20 programs data generator 32 before the start of a memory test to control the manner in which it decodes the pattern generator output data when producing input data for RAM 16. Several address counters (or arithmetic logic units) 34 generate address (ADDR) inputs to RAM 16. For example when 16 includes several addressable blocks, one counter 34 may generate a block address, another counter 34 may generate a row address, and a third counter 34 may generator a column address. The control data output of pattern generator 18 loads counts into address counters 34, selectively increments or decrements those counts during the memory test, and controls a multiplexer 36 selecting the particular address counter 34 output to be applied to RAM 16. A "compare" circuit 38, also controlled by data output of pattern generator 18, compares the data written into each address of RAM 16 to the data read back out to determine whether a memory storage location within RAM 16 is defective at that address. Compare circuit 38 sends a MATCH signal input to pattern generator 18 when it detects that the data read out of a current RAM 16 address matches the data last written into that RAM address.

Status Memory

In accordance with the invention, tester 10 also includes a random "status" memory 70 for storing, when selected events occur during a test, selected "program status" data PSTAT indicating a current status of execution of instructions of an algorithmic program being executed by pattern generator 18. Status memory 70 may also be used to store addresses produced by one or more of address counters 34 in response to events occurring while RAM 16 is being tested.

The program status data PSTAT output of pattern generator 18 includes the contents or outputs of various internal stacks, registers and counters pattern generator 18 uses to keep track of its execution of the algorithmic program defining the test being performed. The program itself selects the particular PSTAT or counter 34 output address that is to be stored in status memory 70, determines the test events (such as DUT failures) that are to trigger a status memory write operation, and selects the status memory address to which the PSTAT or address counter output address is to be written. Host computer 20 may read access the data stored in status memory 70 after the test via bus 30. For example, when appropriately selected during a test, that data can help analysis software to determine the program context of logic or memory test failures.

Status memory 70 includes a RAM 71 for storing a portion of the PSTAT output data of pattern generator 18 or an address output of one of counters 34. A multiplexer 72 controlled by control data (SSEL) output of pattern generator 18 selects the particular data to be written to into RAM 71. An address output (SADDR) of pattern generator 18 determines the address within RAM 71 to which selected PSTAT or addressing data is to be written. Pattern generator 18 also supplies a write signal (SWRITE) to RAM 71 for initiating status memory writes operations.

Pattern Generator Architecture

FIG. 2 illustrates pattern generator 18 of FIG. 1 in more detailed block diagram form. Pattern generator 18 includes an instruction processor 42 for producing the output VECTORS or MTEST data before the start of each test cycle in response to a sequence of algorithmic instructions read out of a program memory 40. Instruction processors 42 also generate the PSTAT, SSEL, SADDR and SWRITE data and signals to status memory 70 during each test cycle. Host computer 20 of FIG. 1 writes an algorithmic test program into program memory 40 via bus 30 prior to the start of a test. Each line of the program is written into a separate address in program memory 40 and includes two instructions, a "program instruction" PINST and a "status instruction" SINST, along with operands (OPERANDS) for each instruction.

After writing a program into program memory 40, host computer 20 (FIG. 1) sends a start command to an instruction processor 42 via bus 30 and a conventional bus interface circuit 43 to tell it to begin a test. Thereafter instruction processor 42, clocked by a master clock signal MCLK at the start of each test cycle, supplies a sequence of read addresses to program memory 40 during the test causing program memory 40 to read out a sequence program instructions PINST and a sequence of status memory instruction SINST, along with their associated operands. The PINST sequence and its operands control the VECTOR or MTEST data sequence instruction processor 42 produces during a logic or memory test and also controls program flow by controlling the manner in which instruction processor 42 read addresses the program memory prior to each test cycle. The FAIL and MATCH signals produced by tester channels 22 and memory test circuit 24 of FIG. 1 are instruction processor 42 inputs which can affect program flow. For example, the PINST program may tell instruction processor 42 to branch to a particular program memory 40 address depending on the states of the FAIL or MATCH signals.

As described below, instruction processor 42 includes internal stacks, registers, and counters that it uses to keep track of its execution of the test program stored in program memory 40. Instruction processor 42 provides the data contents or outputs of those devices as the program status data PSTAT input to status memory 70 of FIG. 1. Instruction processor 42 decodes the SINST sequence output of program memory 40 to produce the SSEL, SADDR and SWRITE signals that select the data to be written to status memory 70, select the address to which it written, and determine the timing of status memory write operations. The PINST instruction sequence can initiate a status memory write operation at predetermined points during a test program, such as for example when a program branches or calls a particular subroutine. The PINST sequence can also initiate a status memory write operation upon detection of a DUT 12 failure indicated by a FAIL or MATCH signal.

Instruction Processor

FIG. 3 illustrates instruction processor 42 of FIG. 2 in more detailed block diagram form. Instruction processor 42 includes an instruction decoder 43 for receiving and decoding the PINST and SINST instructions from program memory 40. An address generator 44, an arithmetic logic unit controlled by instruction decoder 43, supplies input read addresses to program memory 40.

Table I lists example program instructions PINST to which instruction decoder 43 responds.

TABLE I

| PINST/OPERAND | ACTION |
| --- | --- |
| INC | Increment memory address |
| REPEAT N | Repeat memory address for N cycles |
| LOOPSTART N | Repeat instruction loop N times |
| LOOPEND | End of LOOP |
| SUB N | Jump to subroutine at address N |
| RETURN | Return from end of subroutine |
| LOADM N | Load match counter with value N |
| DECM N | Decrement match counter |
| BRANCHM N | Branch to address N on no match |
| LOADR N | Load refresh counter with value N |
| DECR | Decrement refresh counter |
| LOADLVM N | Load LVM start reg. with value N |
| LOADLVMC N | Load LVM cycle count reg. with value N |

The INC program instruction tells instruction decoder 43 to signal address generator 44 to increment the program memory address on the next MCLK pulse. A REPEAT instruction tells instruction decoder 43 to load a value N into a "repeat counter" 45. The value of N is included in a portion of the OPERAND field supplied as input to repeat counter 45. Instruction decoder 43 decrements the repeat counter 45 on each subsequent pulse of the MCLK until its count output reaches 0. At that point, the instruction decoder tells address generator 44 to increment its output address. Thus the control data accompanying a REPEAT instruction is repeated for N test cycles.

Instruction decoder 43 is capable of handling several nested loops and pattern generator 18 includes a separate loop counter 46 and loop start register 47 for each loop. A LOOPSTART instruction at the start of each instruction loop includes an argument in the OPERAND field indicating a number N of times the loop is to be repeated. Instruction decoder 43 responds to a LOOPSTART instruction by loading the current program memory address into one of loop start registers 47 and by loading the value of N into one of loop counters 46. A LOOPEND instruction at the end of each loop tells instruction decoder 43 to decrement the loop counter and to repeat the loop if the loop count has not reached 0. Instruction decoder 43 repeats a loop by loading the contents of a loop start register 47 into address generator 44.

A SUB instruction tells instruction decoder 43 to jump to a subroutine starting at a program memory address N included in the OPERAND field. Instruction decoder 43 loads the value of N into address generator 44 and also pushes the current program memory address onto a subroutine address stack 48 so that it remembers the memory address to which it is to return at the end of the subroutine. A RETURN instruction at the end of a subroutine tells instruction decoder to pop a return address for stack 48 and load it into address generator 44 and signal address generator 44 to increment that address by one so that program flow will return to that return address at the start of the next test cycle.

In some types of RAMs 16 (FIG. 1) that may be tested it is necessary to write data several (N) times in succession to a RAM address before the RAM will store the data. The RAM address is considered defective only if it is unable to retain a data value that has been written to it N times in succession. Pattern generator 18 includes a "match" counter 50 for keeping track of the number of times memory test circuit 24 has written data to such a RAM storage location. A LOADM instruction tells instruction decoder 43 to load an OPERAND field value N into a "match counter" 50 and a DECM instruction tells it to decrement the match counter if the MATCH signal from compare circuit 38 of FIG. 1 indicates the RAM 16 output data does not match the input data. A BRANCHM command tells instruction decoder 43 to branch to program memory address N if the data content of match counter 50 exceeds zero and to otherwise increment the program memory address.

Logic circuit 14 of FIG. 1 read and write accesses RAM 16 during logic tests, but some RAMs need to be refreshed periodically (read and rewrite its stored data) between accesses. In cases where DUT 12 is not capable of doing that internally, tester 10 must periodically refresh RAM 16. A LOADR instruction tells instruction decoder to load an OPERAND field value N into a refresh counter 52 and a DECR instruction tells it to decrement the refresh counter. When the refresh counter 52 output reaches 0, instruction decoder 43 executes a program subroutine that causes memory test circuit 24 of FIG. 1 to refresh RAM 16.

Pattern generator 10 also includes a register 54 for storing several flag bits, and various other instructions supplied to instruction decoder 43 (not listed in Table I) may tell it to write flag data to the flag register or to perform conditional branches based on the contents of the flag register.

As mentioned above pulses of the MCLK signal mark the start of each test cycle and sequence the operations of instruction decoder 43. During a test, each pulse MCLK signal also tells instruction decoder to increment the count of a "cycle" counter 56. The current count output of cycle counter 52 is supplied as data input to an acquisition system 51 which also receives the FAIL signals produced by tester channels 22 of FIG. 1. When one of the tester channels 22 asserts a FAIL signal, acquisition system 51 records the current cycle count and data identifying the tester channel that asserted the FAIL signal. Host computer 20 may read access the data stored in acquisition system 51 via bus 30 after the test is complete. Acquisition system 51 also sends a FAIL signal to instruction decoder 43 when any one of its FAIL input signals is asserted. A BRANCH F instruction tells instruction decoder 43 to branch to an address N when the FAIL single output of acquisition system 51 is asserted and to otherwise increment the program memory address.

Pattern generator 18 includes a random access vector memory 57 for storing and reading out VECTORs to tester channels 22 MTEST control data to memory test circuit 24 of FIG. 1. Host computer 20 of FIG. 1 writes the vectors and control data into vector memory 57 before the start of a test via bus interface circuit 43 of FIG. 2. An arithmetic logic unit (ALU) 59 provides a read address to vector memory 57 before each test cycle so that it reads out the appropriate vector or control data for the test cycle. A LOADLVM program instruction tells instruction decoder 43 to load a start address of OPERAND field value N into an "LVM (logic vector memory) start address" register 58. A LOADLVMC tells the instruction decoder to load an LVM cycle count register 59 with an OPERAND value N indicating the number of cycles for which vector memory 26 is to carry out this operation. Thereafter instruction decoder signals ALU 59 to increment the memory address and signals LVM cycle count register to decrement its count during each test cycle. Instruction decoder 43 increments the program memory address with the LVM cycle count reaches 0 before obtaining a next program instruction PINST.

Status Instruction

We test DUT 12 to determine whether it is defective, but we may also want to learn why it is defective. In particular we may want to know not only what part of DUT 12 failed to perform as expected but also the test conditions under which that part failed. To understand the "program context" of a DUT failure, a test engineer would want to know, for example, that the DUT failed in response to a repeat instruction at some particular address in program memory 40, that the pattern generator 18 was currently executing the 12th repetition of the repeat instruction, that the repeat instruction was embedded at an offset of 10 addresses in a program loop starting at some particular program memory address, that the program loop was contained in a subroutine called at a particular address, and that the processor was currently on the 5th repetition of the loop when the failure occurred. When the course of a test is deterministic, not dependent on test results, conventional failure analysis software can determine the program context of the failure from the number of the test cycle in which the failure occurred. That test cycle information is stored by acquisition system 51 during the test and is available to host computer 20 at the end of the test.

However it is not possible to determine the program context of a DUT failure solely from test cycle number of the failure when the test program memory 40 branches or calls subroutines depending on the behavior of DUT 12 during the test. Such a program is "non-deterministic" because it is not possible to predict the course of the test. In particular it may not be possible to predict how many cycles will be needed to reach a particular point in the test program. Thus when the test is non-deterministic, failure analysis software cannot correlate a particular test cycle number with a point in the program stored in program memory 40 without knowing the history of the test leading up to that particular test cycle. In such case, the cycle data stored in acquisition system 51 does not provide sufficient basis to allow failure analysis software to determine the program context of a failure. Accordingly status memory 70, along with the status instructions SINST included in the program stored in program memory 40 are provided as a mechanism for allowing tester 10 to record data that can help a test engine, or any failure analysis software the test engineer may employ, to determine the program context of events such as a DUT failures when the test program is non-deterministic. Table II lists example status instructions SINST.

TABLE II

| SINST/OPERAND | ACTION |
| --- | --- |
| LSADDR N | Load address N into status ALU |
| LSADDRW N SSEL | Load address N into status ALU |
| INCSADDR | Increment status address |
| WSFAIL SEL | Write to status memory on FAIL |
| WSMF SEL | Write to status memory on MATCH failure |
| WSMC SEL | Write to status memory if match count is 0 |
| WSFLAG N SEL | Write to status if flag bit N is true |

The LSADDR instruction tells instruction decoder 43 to load an OPERAND address of value N into an ALU 76 providing the SADDR input to status memory 70 of FIG. 1. The LSADDRW instruction tells instruction decoder 43 to load an OPERAND address of value N into ALU 76 and to then assert the SWRITE signal so that status memory 70 stores data selected by SSEL data included in the OPERAND output of program memory 40. The INCADDR instruction tells instruction decoder 43 signal ALU 76 to increment its output address and to then assert the SWRITE signal. The WSFAIL instruction tells instruction decoder 43 to increment the write address and write to status memory 70 when the FAIL signal is asserted. The WSMF command signal tells instruction decoder 43 to increment the write address and to write to status memory 70 when the MATCH signal is not asserted. The WSMC command tells instruction decoder 43 to increment the write address and write to status memory 70 if the match count in counter 50 has reached 0. The WSFLAG command tells instruction decoder 43 to increment the write address and write to status memory 70 if the Nth bit of flag register 54 has been set.

By including state memory control instructions SIT and operands in the pattern generator program, a test engineer has wide latitude in controlling the use of status memory 70. For example, the test program may include one or more routines for loading a sequence of status data into status memory 70 when various events occur, such as MATCH or FAIL events, subroutine calls, branches etc. This type of information helps the test engineer to analyze test results to determine the nature of DUT failures and the test conditions that led to them.

Spare Row/Column Replacement

Random access memories (RAMs) are typically formed as arrays of rows and columns of memory cells. The input address to a RAM identifies the particular row and column of the cell to be read or write accessed. Some RAMs include spare rows and/or columns of memory cells so that when one of the RAM's cells is defective, the RAM can be modified to replace the row or column of a defective cell with one of its spare rows or columns. Prior art RAM testers typically include a data acquisition RAM having a cell corresponding to each cell of the RAM under test. Each cell of the data acquisition RAM stores a pass/fail bit indicating whether the corresponding cell of the RAM under test has passed or failed the test. Such a prior art RAM tester writes the appropriate pass/fail bit to each data acquisition memory cell during a test. After the test a host computer reads that data out of the data acquisition memory, determines which cells of the RAM under tester are defective, and then determines how to allocation spare rows and columns to replace rows and columns containing defective cells. The large size of the acquisition memory of prior art RAM testers can be problematic. Also while the host computer is reading the large amount of pass/fail data out of the acquisition memory at the end of a test, the prior art tester is unavailable for testing another RAM.

The architecture of tester 10 of the present invention enables tester 10 to store all of the information that would be needed for host computer 20 to allocate spare rows and columns in a relatively compact from in RAM 71 of status memory 70 that host computer 20 can quickly read at the end of a test.

As discussed above, when testing RAM 16, tester 10 employs address counters 34 to generate the row and column addresses for RAM 16. When RAM 16 includes spare rows and or columns, the status instruction for each compare cycle can tell pattern generator 18 to write the current row and column address into status memory 70 whenever the MATCH signal output of compare circuit 38 indicates that the currently accessed RAM 16 cell is defective. At the end of the test, host computer 20 may read the address data in status memory 70 to determine the row and column addresses of defective cells. This information can be used by failure analysis software running in host computer 20 to determine how to allocate spare rows and columns when replacing rows and or columns of RAM 16 containing defective cells. Since status memory 70 stores only the row and column address of defective cells, only a relatively small amount of data must be transferred to host computer 20 at the end of the test. Thus host computer 20 can read the test results data out of tester 10 needed to reconfigure RAM 16 much quicker than it could read results data out of prior art testers that must store a pass/fail bit for every memory cell of the RAM under test. Status memory 71 can be much smaller than a pass/fail data acquisition memory of a prior RAM tester.

Block Failures

Some non-volatile memories are organized into blocks of memory with each block having a separate block address, Thus a particular memory cell will have a block address, a row address and a column address. Such memories can often be reconfigured so that they avoid using block that may have a minimum number of defective cells. In other words, a memory having a defective block is reconfigured to act as a smaller memory that does not include the defective block in its address space.

To avoid having to provide a large pass/fail data acquisition for storing pass/fail data for all cells of all blocks, a typical prior art memory tester will separately test each memory block. A host computer reads the pass/fail data out of the acquisition memory after each block test. Failure analysis software in the host computer then decides how reconfigure the RAM to avoid using failed blocks. This process is time-consuming not only because the host must read and process a large amount pass/fail data, but also because the tester has to be stopped and restarted once for each memory block.

When tester 10 of FIG. 1 tests a RAM 16 having separately addressable memory blocks, one of address counters 34 generates the block address, another of address counters 34 generates the row address and another of address counter 34 generates the column address. When host computer 20 is only interested in knowing which blocks contain defective cells, the status instruction SINST can tell pattern generator 18 to store only the block address output of one of address counters 34 whenever the MATCH signal output of compare circuit 38 indicates that a cell of a currently addressed block of the RAM 16 under test is defective. Where the RAM 16 under test also includes spare rows and columns, the row and column address of defective memory cells may also be stored in status memory 70 along with the block address. The host computer 20 can then use the information to determine which blocks are to be bypassed, and to determine how to allocate spare rows and columns to the remaining blocks.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An apparatus for performing a test on an integrated circuit device under test (DUT), the apparatus comprising:
    a pattern generator for executing an algorithmic program comprising instructions defining a sequence of test control data and defining a sequence of status memory control data, wherein as it executes said algorithmic program, said pattern generator generates said test control data and said status memory control data, and also generates program status data indicating a current status of execution of instructions of said algorithmic program;
    means for performing said test on the DUT in response to said test control data; and
    a status memory for receiving and storing said program status data in response to said status memory control data.

2. The apparatus in accordance with claim 1 wherein said instructions comprise a first sequence of program instructions defining said test control data and a second sequence of status instructions defining said status control data.

3. The apparatus in accordance with claim 1 wherein said status memory comprises a random access memory, and wherein a first portion of said status memory control data addresses said random access memory.

4. The apparatus in accordance with claim 3 wherein a second portion of said status memory control data write enables said random access memory.

5. The apparatus in accordance with claim 4 wherein said status memory further comprises multiplexing means controlled by a third portion of said status memory control data for selectively applying separate portions of said program status data as data input to said random access memory.

6. The apparatus in accordance with claim 1 wherein said pattern generator comprises:
    an addressable program memory for storing and currently reading out said instructions; and
    instruction processing means for supplying an address input to said addressable program memory causing said addressable program memory to read out said instructions, for receiving said instructions read out of said addressable memory and for generating said address input, said test control data and said status control data in response thereto.

7. The apparatus in accordance with claim 6 wherein said test is organized into a succession of test cycles;
    wherein said instruction processor provides an address input to said addressable program memory for each of said test cycles,
    wherein said instructions include a REPEAT instruction telling said instruction processing means to supply a particular address as input to said addressable program memory for a plurality of said test cycles,
    wherein said instruction processor includes means for storing a repeat count indicating a number of said plurality of test cycles that have occurred, and
    wherein said repeat count is included as a portion of said program status data received and stored by said status memory.

8. The apparatus in accordance with claim 6
    wherein said test is organized into test cycles;
    wherein said instruction processor provides an address input to said addressable program memory for each of said test cycles,
    wherein said instructions include a LOOP instruction telling said instruction processing means to supply a particular sequence of addresses as input to said addressable program memory for a plurality of said test cycles,
    wherein said instruction processor includes means for storing a loop count indicating a number of times said instruction processor has supplied said particular sequence address to said addressable program memory, and
    wherein said loop count is included as a portion of said program status data received and stored by said status memory.

9. The apparatus in accordance with claim 6
    wherein said test is organized into test cycles;
    wherein said instruction processor provides an address input to said addressable program memory for each of said test cycles,
    wherein said instructions include a CALL instruction telling said instruction processing means to supply a particular sequence of addresses defined by a subroutine of said instructions stored in said program memory as input to said addressable program memory for a plurality of said test cycles,
    wherein said instruction processor includes means for storing a starting address of said addressable program memory containing a starting address of said subroutine of instructions, and
    wherein said starting address is included as a portion of said program status data received and stored by said status memory.

10. The apparatus in accordance with claim 6
    wherein said means for performing said test on said DUT in response to said test control data detects a behavior of said DUT during said test and produces an indicating signal indicating the DUT's detected behavior, said indicating signal being supplied as input to said instruction processor,
    wherein said test is organized into a succession of test cycles, wherein said instruction processor provides an address input to said addressable program memory for each of said test cycles, and wherein at least one of said instructions tells said instruction processor to set said address input to a value that is determined by a state of said indicating signal.

11. The apparatus in accordance with claim 1 wherein said DUT includes a random access memory (RAM), wherein said means for performing said test on said DUT in response to said test control data generates a RAM address applied as input to said RAM, and wherein said status memory also receives and stores said RAM address in response to said status memory control data.

12. The apparatus in accordance with claim 11 wherein a first portion of said status memory control data addresses said status memory, wherein a second portion of said status memory control data write enables said status memory, and wherein said a third portion of said status memory control data selectively determines whether said statutes memory is to store a portion of said program status data or the generated RAM address.

13. An apparatus for performing a test on an integrated circuit device under test (DUT), the apparatus comprising:

a pattern generator for executing an algorithmic program comprising instructions defining a sequence of test control data and defining a sequence of status memory control data, wherein as it executes said algorithmic program, said pattern generator generates said test control data and said status control data, and also generates program status data indicating a current status of execution of instructions of said algorithmic program;

means for performing said test on the DUT in response to said test control data;

a random access status memory for receiving and storing input data in response to said status memory control data; and multiplexing means controlled by said status memory control data for selectively applying separate portions of said program status data as said input data to said random access status memory.

14. The apparatus in accordance with claim 13 wherein said pattern generator comprises:

an addressable program memory for storing and currently reading out said instructions in response to an address input supplied thereto; and instruction processing means for supplying said address input to said addressable program memory causing said addressable program memory to read out said instructions, for receiving said instructions read out of said addressable memory and for generating said address input, said test control data and said status memory control data in response thereto.

15. The apparatus in accordance with claim 14 wherein said means for performing said test on said DUT in response to said test control data detects a behavior of said DUT during said test and produces an indicating signal indicating the DUT's detected behavior, said indicating signal being supplied as input to said instruction processor, and wherein at least one of said instructions tells said instruction processor to set said address input to said addressable programming memory to a value that is determined by a state of said indicating signal supplied as input to said instruction processor.

16. The apparatus in accordance with claim 15 wherein said DUT includes a random access memory (RAM), wherein said means for performing said test on said DUT in response to said test control data generates a RAM address applied as input to said RAM, and wherein said status memory also receives and stores said RAM address in response to said status memory control data.

17. The apparatus in accordance with claim 16 wherein a first portion of said status memory control data addresses said status memory, wherein a second portion of said status memory control data write enables said status memory, and wherein said a third portion of said status memory control data selectively determines whether said statutes memory is to store a portion of said program status data or the generated RAM address.

* * * * *